US012628400B2

(12) United States Patent
Patil et al.

(10) Patent No.: US 12,628,400 B2
(45) Date of Patent: May 12, 2026

(54) SEAM FREE TITANIUM NITRIDE GAPFILL

(71) Applicant: Applied Materials, Inc., Santa Clara, CA (US)

(72) Inventors: Radhika P. Patil, Mountain View, CA (US); Tatsuya E. Sato, San Jose, CA (US); Haoyan Sha, San Jose, CA (US); Abinash Tripathy, Santa Clara, CA (US); Michael S. Jackson, Sunnyvale, CA (US); Janardhan Devrajan, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 436 days.

(21) Appl. No.: 18/203,417

(22) Filed: May 30, 2023

(65) Prior Publication Data

US 2024/0404830 A1     Dec. 5, 2024

(51) Int. Cl.
| | |
|---|---|
| *H10D 64/01* | (2025.01) |
| *H10D 30/43* | (2025.01) |
| *H10D 30/67* | (2025.01) |
| *H10D 62/10* | (2025.01) |

(52) U.S. Cl.
CPC ....... *H10D 64/01318* (2026.01); *H10D 30/43* (2025.01); *H10D 30/6735* (2025.01); *H10D 30/6739* (2025.01); *H10D 62/121* (2025.01)

(58) Field of Classification Search
CPC .............. H01L 21/28088; H10D 30/43; H10D 30/6735; H10D 30/6739; H10D 62/121
See application file for complete search history.

(56) References Cited

U.S. PATENT DOCUMENTS

| | | | |
|---|---|---|---|
| 9,224,675 | B1 * | 12/2015 | DeHaven .......... H01L 23/53266 |
| 11,152,221 | B2 | 10/2021 | Li et al. |
| 2006/0027932 | A1 * | 2/2006 | Yu ...................... H01L 21/76846 |
| | | | 257/765 |
| 2007/0271751 | A1 | 11/2007 | Weidman |
| 2008/0124919 | A1 * | 5/2008 | Huang .............. H01L 21/02063 |
| | | | 438/643 |
| 2009/0200671 | A1 * | 8/2009 | Lee ........................ H01L 23/481 |
| | | | 257/751 |
| 2010/0003406 | A1 | 1/2010 | Lam et al. |
| 2012/0237693 | A1 * | 9/2012 | Jackson .............. C23C 16/4405 |
| | | | 427/349 |
| 2013/0264620 | A1 * | 10/2013 | Yu ...................... H01L 21/76862 |
| | | | 438/653 |
| 2018/0047898 | A1 | 2/2018 | Ridgeway et al. |
| 2018/0230587 | A1 | 8/2018 | Firouzdor et al. |
| 2021/0036147 | A1 * | 2/2021 | Wang ...................... H10D 64/66 |
| 2021/0050186 | A1 | 2/2021 | Chen et al. |
| 2022/0093468 | A1 * | 3/2022 | Lee ........................ H10D 30/62 |
| 2022/0108916 | A1 * | 4/2022 | Yang ................. H01L 23/53252 |
| 2022/0165852 | A1 * | 5/2022 | Gandikota .............. C23C 16/06 |

* cited by examiner

*Primary Examiner* — Brian Turner
(74) *Attorney, Agent, or Firm* — SERVILLA WHITNEY LLC

(57) ABSTRACT

Embodiments of the disclosure relate to methods of depositing seam-free gapfill. In some embodiments, the gapfill consists of titanium nitride. The gapfill methods comprise forming a first layer and a second layer. The firs layer is formed without treatment or densification, while the second layer is formed with periodic treatment. The resulting gapfill in advantageously seam-free.

20 Claims, 2 Drawing Sheets

100

200

200

SEAM FREE TITANIUM NITRIDE GAPFILL

TECHNICAL FIELD

Embodiments of the disclosure generally relate to electronic devices and methods of forming electronic devices. In particular, some embodiments of the disclosure provide seam-free titanium nitride films.

BACKGROUND

Gapfill of features and structures is an ongoing challenge in the field of semiconductor manufacturing. Many processes affect regions near an opening more than within the feature. Accordingly, the quantity and composition of the deposited film can vary depending on the location within the feature. This variability can lead to premature closing where a feature opening is closed before the feature is filled.

To remedy this problem, multi-stage cyclic processes have been developed which both deposit and etch the film. These processes suffer from increased processing times, decreased throughput and potential adverse effects from halogen-based etching processes.

In some cases, deposition-only schemes, particularly those which use plasma, can be tuned to deposit and densify a material within a feature without prematurely closing the feature. These materials, however, can suffer from defects (e.g., seams within the deposited material.

Therefore, there remains a need for processes to deposit defect free gapfill within features.

SUMMARY

One or more embodiments of the disclosure are directed to a method of seamless titanium nitride gapfill. The method comprises depositing a first TiN layer by exposing a substrate surface with at least one feature therein to a titanium amide precursor. A second TiN layer is deposited by exposing the first TiN layer to a titanium precursor and a nitrogen-containing plasma. The first and second TiN layers combine to fill the at least one feature with a gapfill material substantially free of any defects.

Additional embodiments of the disclosure are directed to a method of depositing titanium nitride gapfill. The method comprises depositing a first TiN layer by thermal decomposition by exposing a substrate surface with at least one feature therein to TDMAT; the first TiN layer being amorphous. A second TiN layer is deposited by exposing the first TiN layer to a plurality of cycles comprising a deposition phase and treatment phase, the deposition phase comprising TDMAT, the treatment phase comprising a nitrogen-containing plasma. The first and second TiN layers combine to fill the at least one feature with a majority crystalline TiN gapfill material which is substantially free of any defects.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1:
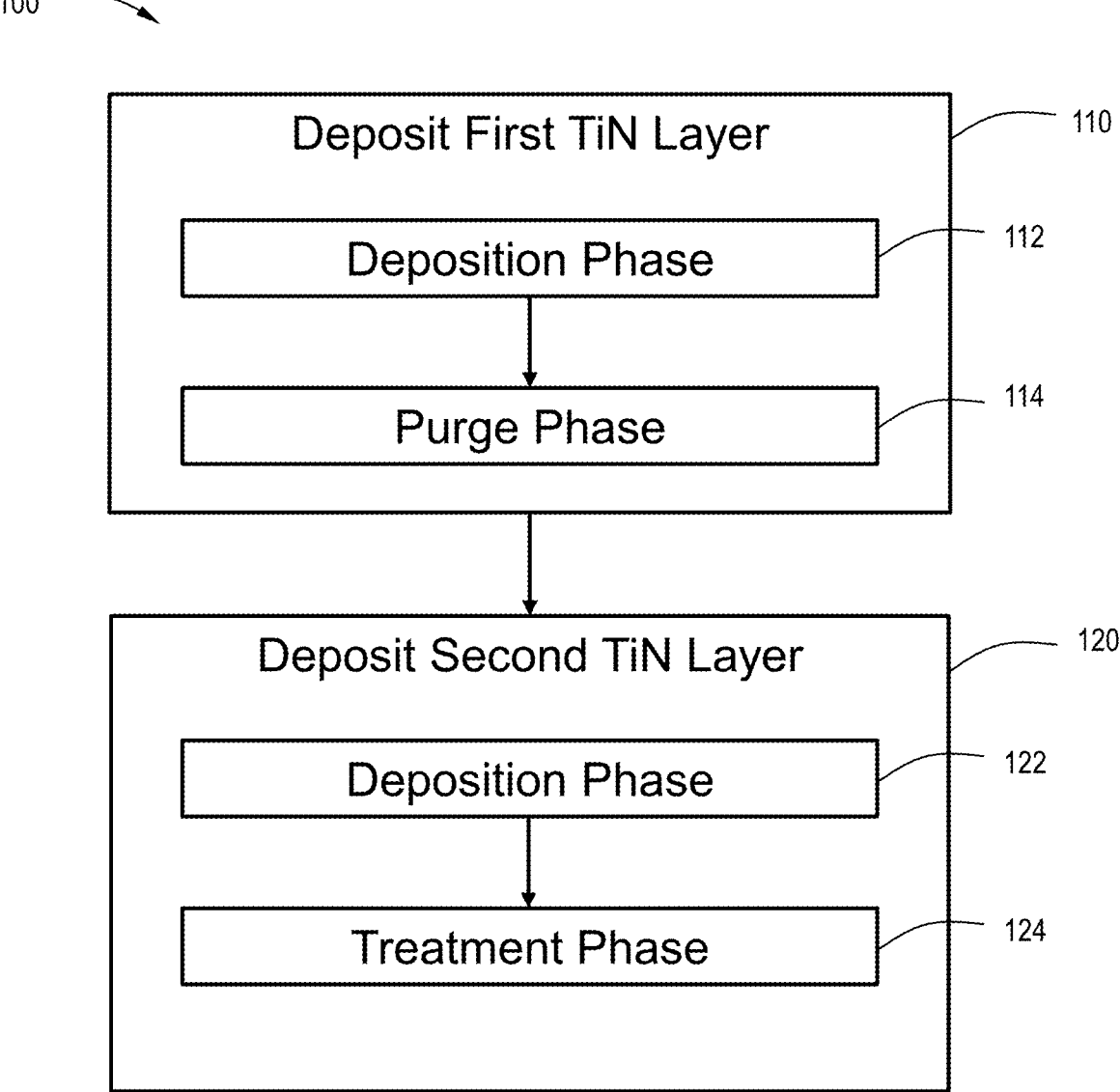
FIG. 1 illustrates a process flow of a gapfill method in accordance with one or more embodiments of the disclosure.

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates.

While the majority of this disclosure relates to the deposition of titanium nitride films, those skilled in the art should recognize that similar methods may be applied to the deposition of other metal nitride films, specifically tantalum nitride.

One or more embodiments of the disclosure advantageously provide methods for depositing seam-free titanium nitride gapfill. Without being bound by theory it is believed that seams are formed within the gapfill material when the material, grown from each sidewall, meets near the center of a feature. With respect to titanium nitride gapfill materials, it is believed that any seam disrupts crystalline continuity and may adversely affect electrical properties (e.g., resistance), barrier properties and/or physical properties (e.g., density).

Further, additional embodiments of the disclosure advantageously provide methods for depositing void-free titanium nitride gapfill. Without being bound by theory it is believed that seams are formed within the gapfill material when the material grows faster near the opening of a feature than within a feature. This can lead to the material pinching closed the feature opening before the feature is completely filled. Current methods for achieving void-free gapfill may rely on re-opening the feature by etching the material from the feature opening. In some embodiments, the methods disclosed herein advantageously fill a feature without the use of an etch process to remove material from the substrate surface.

Figure 2A:
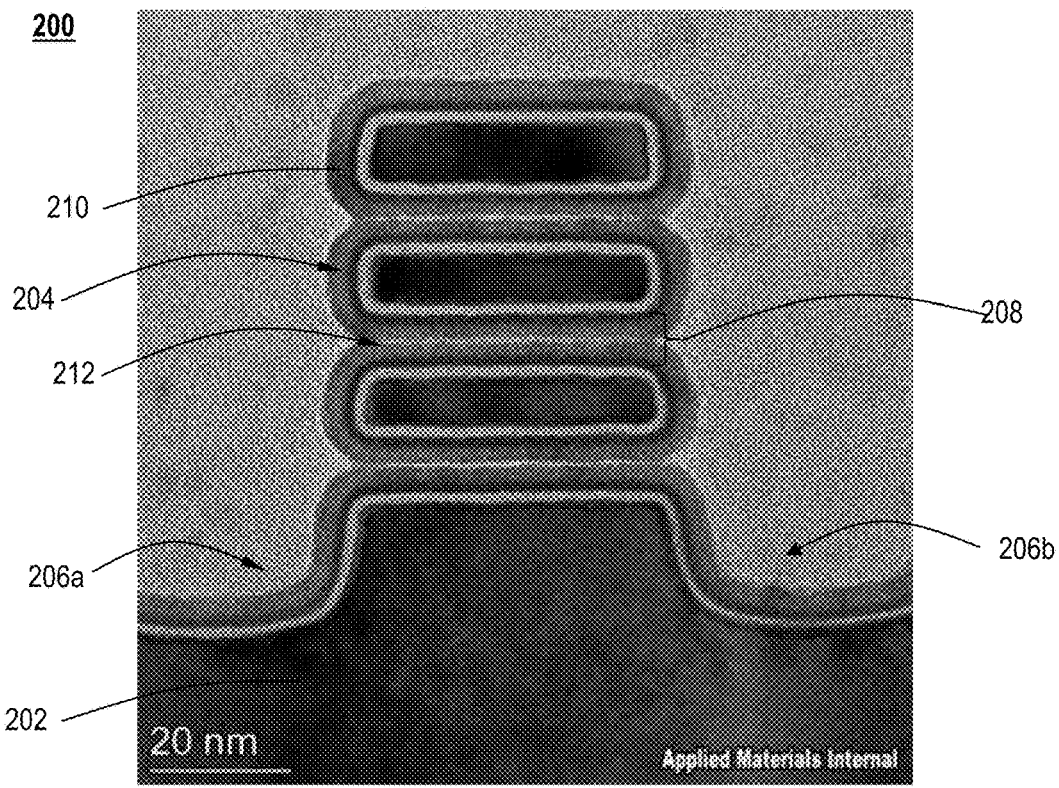
FIGS. 2A and 2B illustrate TEM images of resulting GAA semiconductor substrates according to exemplary embodiments of the disclosure.
Figure 2B:
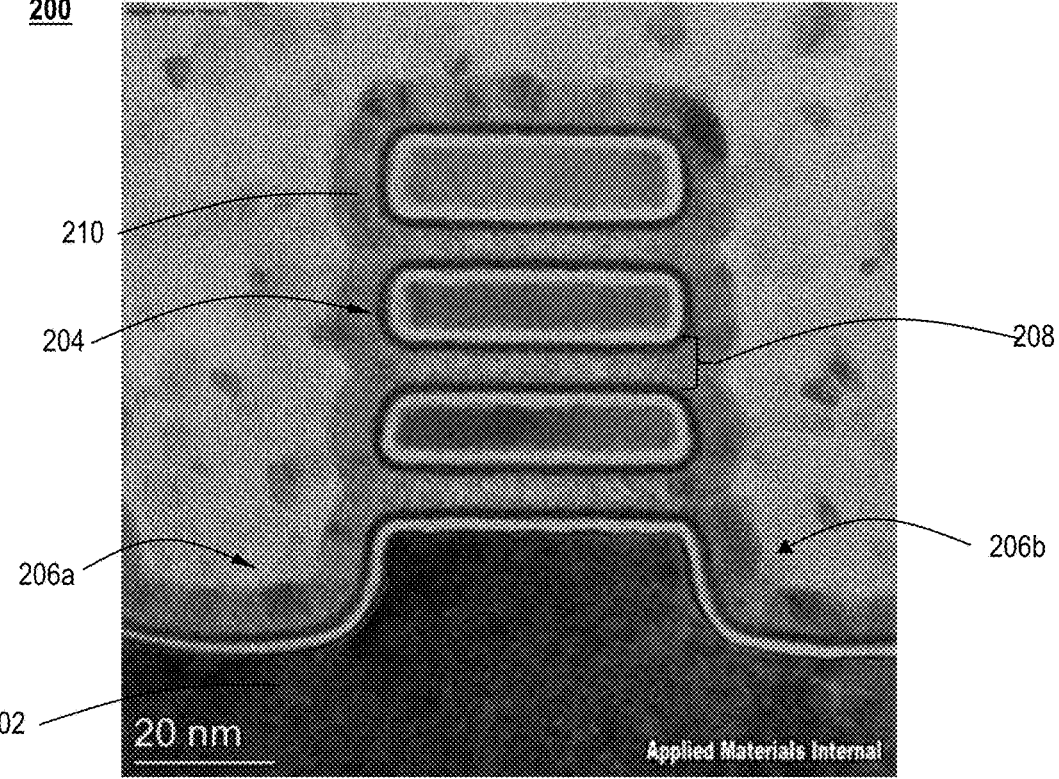

Referring to the Figures, the disclosure relates to a method 100 for depositing titanium nitride gapfill which is substantially free of any defects. FIG. 1 depicts a process flow diagram of a method 100 in accordance with one or more embodiment of the present disclosure. FIGS. 2A-2B depict TEM images of exemplary GAA semiconductor substrates 200 after processing according to one or more embodiments of the present disclosure.

While the Figures illustrate a specific substrate structure, the methods of the disclosure are equally applicable to substrates of different shapes, including substrates with trenches, or vertical vias.

The method 100 begins with operation 110. At operation 110, a first layer of TIN (also referred to as a first TiN layer) is deposited on a semiconductor substrate surface by exposing the semiconductor substrate surface to a titanium amide precursor.

The semiconductor substrate surface has at least one feature formed therein. The shape of the feature can be any suitable shape including, but not limited to, trenches, holes and vias (circular or polygonal). As used in this regard, the term "feature" refers to any intentional surface irregularity. Suitable examples of features include but are not limited to trenches, which have a top, two sidewalls and a bottom extending into the substrate, and vias which have one or more sidewall extending into the substrate to a bottom. The present disclosure also contemplates that the feature may be oriented horizontally or vertically relative to the larger substrate on which it is formed. In some embodiments, the feature has an opening width in a range of about 30 Å to about 50 Å, or in a range of about 40 Å to about 50 Å.

Without being bound by theory, the inventors have found that even with the relatively narrow widths disclosed herein, the disclosed methods are able to deposit titanium nitride gapfill which is substantially free of any seams.

FIGS. 2A-2B illustrate cross-sectional view of gate all around (GAA) structures 200 on top of a semiconductor substrate (202) with three nanosheets 204 stacked on top of each other. Each nanosheet 204 extends between a source 206a and a drain 206b of the transistor. The nanosheets 204 are not in contact with each other, leaving a small gap 208 or feature between them. Accordingly, films deposited on the gate all around (GAA) structure 200 deposit on and between the nanosheets 204.

The titanium amide precursor of operation 110 can be any suitable titanium precursor comprising at least one amide ligand. In some embodiments, the titanium amide precursor comprises only amide ligands. In some embodiments, the amide ligand comprises a dialkylamido ligand. In some embodiments, the two alkyl groups of the dialkylamido ligand are the same. In some embodiments, the two alkyl groups of the dialkylamido ligand are different. In some embodiments, the alkyl groups are independently selected from methyl, ethyl, propyl, isopropyl, butyl, secbutyl, isobutyl or tertbutyl. In some embodiments, the titanium precursor comprises or consists essentially of tetrakis(dimethylamido) titanium (TDMAT).

Other amide precursors suitable for use at operation 110 include tantalum amide precursors. These precursors may be defined as above with respect to the titanium amide precursors. In some embodiments, the tantalum nitride precursor comprises or consists essentially of Pentakis(dimethylamino)tantalum (PDMAT) or tert-butylimido)tris(ethylmethylamido)tantalum (TBTEMT).

In some embodiments, the deposition process at operation 110 is a thermal decomposition process. For the avoidance of doubt a thermal decomposition process deposits a film without any additional reactant. Further, the film is deposited without forming plasma, radicals or ions. The titanium amide precursor of the disclosed embodiments provides both the titanium and the nitrogen necessary to form a titanium nitride film.

The semiconductor substrate surface may be maintained at any suitable temperature to deposit the first TiN layer. In some embodiments, the semiconductor substrate surface is maintained at a temperature in a range of about 100° C. to about 450° C., in a range of about 250° C. to about 350° C., or in a range of about 250° C. to about 300° C. In some embodiments, the semiconductor substrate is maintained at a temperature of about 270° C. or about 300° C.

In some embodiments, the processing pressure during operation 110 is controlled. In some embodiments, the titanium amide precursor is exposed to the semiconductor substrate surface at a pressure in a range of about 0.3 Torr to about 5 Torr, in a range of about 0.5 Torr to about 5 Torr, or in a range of about 1 Torr to about 5 Torr.

In some embodiments, operation 110 comprises a deposition phase 112 and a purge phase 114. Stated differently, in some embodiments, depositing the first TiN layer 110 comprises exposing 112 the semiconductor substrate surface to a titanium amide precursor for a first period of time and subsequently purging 114 the semiconductor substrate surface of the titanium amide precursor and/or any reaction by products for a second period of time. In some embodiments, the deposition phase 112 and the purge phase 114 may be repeated as a cycle to form a predetermined thickness of the first TiN layer.

In some embodiments, the first period is in a range of about 2 seconds to about 5 seconds. In some embodiments, the first period is about 2.5 seconds. In some embodiments, the second period is in a range of about 2 seconds to about 5 seconds. In some embodiments, the second period is about 3.5 seconds. In some embodiments, operation 110 consists of in a range of about 25 to about 50 deposition-purge cycles. In some embodiments, operation 110 consists of about 40 cycles. In some embodiments, the predetermined thickness of the first TiN layer is in a range of about 25 Å to about 50 Å, or in a range of about 30 Å to about 40 Å.

After the first TiN layer has reached the predetermined thickness, the method 100 continues to operation 120. At operation 120, a second TiN layer is deposited by exposing the first TiN layer to a titanium precursor and a nitrogen-containing plasma. After depositing the second TiN layer, the first and second TiN layers combine to fill at least a portion of the at least one feature with a gapfill material substantially free of any seams. In some embodiments, the gapfill material fills the at least one feature.

A seam is formed when deposited materials meet but the surfaces of the materials fail to integrate, leaving a line of mismatched material, often near the center of a gap. A void is formed when deposited materials close off an opening to form a hole or void within a deposited material.

Based on these definitions, a material which is "substantially free of any seams" is one in which the volume of any seam is less than 1%, less than 0.5%, less than 0.2%, or less than 0.1% of the material volume as a whole.

In some embodiments, at operation 120, the second TiN layer is formed by a plurality of dep-treat cycles comprising at least one deposition phase 122 and at least one treatment phase 124. The deposition phase 122 comprises exposing the first TiN layer to the titanium precursor to form an untreated TiN layer. The treatment phase 124 comprises exposing the untreated TiN layer to the nitrogen-containing plasma to form the second TiN layer.

The titanium precursor used during the deposition phase 122 is described above with respect to deposition of the first TiN layer. The titanium precursor of the first TiN layer and the second TiN layer may be the same or different.

In some embodiments, the nitrogen-containing plasma of the treatment phase is formed from nitrogen gas ($N_2$). In some embodiments, the nitrogen-containing plasma is formed away from the semiconductor substrate surface. Stated differently, in some embodiments, the nitrogen-containing plasma is a remote plasma.

The nitrogen-containing plasma may have any suitable power. In some embodiments, the nitrogen-containing plasma has a power in a range of about 1500 W to about 6000W, in a range of about 2000 W to about 5000 W, in a range of about 2500 W to about 4000 W, or in a range of about 2800W to about 3500 W. In some embodiments, the nitrogen-containing plasma has a power of about 3000 W.

In some embodiments, the dep-treat cycles of operation 120 may vary during operation 120. For example, if treatment A used a low power plasma of 2000 W and treatment B used a high power plasma of 4000 W, operation 120 may include 20 cycles using treatment A and 20 cycles using treatment B. The alternate treatment cycles may be sequential (all A cycles followed by all B cycles) or interspersed (10 A, 10 B, 10 A, 10 B).

In some embodiments, the processing conditions (e.g., semiconductor substrate temperature, pressure) are maintained from operation 110 to operation 120. Stated differently, for example, in some embodiments, the semiconductor substrate is maintained at the same temperature during operation 120 as during operation 110. However, in some embodiments, the processing conditions may change between operation 110 and operation 120. In these embodiments, the processing conditions for operation 120 are selected from those described above with respect to operation 110.

Without being bound by theory, it is believed that the treatment phase of operation 120 also treats the first TiN layer deposited by operation 110. The inventors have unexpectedly found that if the TiN gapfill is deposited with only the dep-treat cycle of operation 120 a seam is formed; however, the disclosed methods advantageously provide a TiN gapfill without a seam.

In some embodiments, the first TiN layer is amorphous after being deposited by operation 110. Further, in some embodiments, the second TIN layer formed by operation 120 may be substantially crystalline. Overall, in some embodiments, the gap fill material formed by method 100, including both operation 110 and operation 120, is majority crystalline. As used in this regard, a material which is majority crystalline is crystalline within at least 50%, at least 70%, at least 80%, or at least 90% of the material volume.

In some embodiments, the first TiN layer has a density in a range of about 3.5 $g/cm^3$ to about 3.8 $g/cm^3$. In contrast, in some embodiments, the gapfill material formed by method 100, including both operation 110 and operation 120, has a density in a range of about 3.0 $g/cm^3$ to about 5.0 $g/cm^3$, or in a range of about 4.8 $g/cm^3$ to about 5.2 $g/cm^3$.

EXAMPLES

Example 1: DEP-Treat Only

A first sample was prepared by exposing a three gate layer GAA structure to 40 cycles of deposition and treatment at 300° C. The deposition phase exposed the semiconductor substrate to TDMAT at a flow rate of 600 sccm and 4 Torr for 2 seconds. The treatment phase exposed the semiconductor substrate to a $N_2$ (2000 sccm) plasma of 3000 W at 1 Torr for 10 seconds. The deposition and treatment phases were alternated to perform 40 of each phase.

A TEM image of the resulting GAA structure 200 with a TiN layer 210 deposited thereon is shown in FIG. 2A. The TEM image shows a small seam 212 between each of the nanosheets 204 (seam 212 is shown in the image FIG. 2A as lighter grey "space"). The inventors noted that the seam 212 does not fill with further cycles of deposition.

Example 2: DEP, Dep-Treat

A second sample was prepared by exposing a three gate GAA structure at 300° C. to 40 cycles of deposition followed by 40 cycles of dep-treat. The first deposition phase exposed the semiconductor substrate to TDMAT at a flow rate of 600 sccm and 4 Torr for 2 seconds. After each deposition phase, the chamber was purged before beginning another deposition phase.

After 40 cycles of deposition, the semiconductor substrate was exposed to 40 cycles of deposition and treatment at 300° C. The deposition phase exposed the semiconductor substrate to TDMAT at a flow rate of 600 sccm and 4 Torr for 2 seconds. The treatment phase exposed the semiconductor substrate to a $N_2$ (2000 sccm) plasma of 3000 W at 1 Torr for 10 seconds. The deposition and treatment phases were alternated to perform 40 of each phase.

A TEM image of the resulting GAA structure 200 with a TiN layer 210 deposited thereon is shown in FIG. 2B. The TEM image shows no space or seam between each of the nanosheets 204. Accordingly, the dep, dep-treat process provided seam-free gap fill.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:

1. A method of depositing titanium nitride gapfill, the method comprising:

exposing a semiconductor substrate surface to a titanium amide precursor to form a first TiN layer, the semiconductor substrate surface comprising a plurality of stacked nanosheets and at least one feature between adjacent nanosheets, the first TiN layer forming around the plurality of nanosheets; and exposing the first TiN layer to a titanium precursor and a nitrogen-containing plasma to form a second TiN layer directly on the first TiN layer, wherein the first TiN layer and the second TiN layer combine to completely fill the at least one feature with a TiN gapfill material which is substantially free of a seam.

2. The method of claim 1, wherein the at least one feature has a width in a range of about 4 nm to about 5 nm.

3. The method of claim 1, wherein the titanium amide precursor comprises tetrakis(dimethylamido)titanium (TDMAT).

4. The method of claim 1, wherein depositing the first TiN layer comprises a thermal decomposition process.

5. The method of claim 1, wherein the semiconductor substrate surface is maintained at a temperature in a range of about 250° C. to about 350° C. while forming the first TiN layer.

6. The method of claim 1, wherein the semiconductor surface is exposed to the titanium amide precursor at a pressure in a range of about 1 Torr to about 5 Torr.

7. The method of claim 1, wherein the first TiN layer is formed by a plurality of dep-purge cycles comprising at least one deposition phase and at least one purge phase.

8. The method of claim 1, wherein the second TiN layer is formed by a plurality of dep-treat cycles comprising at least one deposition phase and at least one treatment phase.

9. The method of claim 8, wherein the deposition phase comprises exposing the first TiN layer to the titanium precursor to form an untreated TiN layer.

10. The method of claim 9, wherein the titanium precursor comprises tetrakis(dimethylamido)titanium (TDMAT).

11. The method of claim 9, wherein the treatment phase comprises exposing the untreated TiN layer to the nitrogen-containing plasma to form the second TiN layer.

12. The method of claim 1, wherein the nitrogen-containing plasma is formed from nitrogen gas ($N_2$).

13. The method of claim 1, wherein the nitrogen-containing plasma is formed away from the semiconductor substrate surface.

14. The method of claim 1, wherein the nitrogen-containing plasma has a power in a range of about 2000 W to about 5000 W.

15. The method of claim 1, wherein the semiconductor substrate surface is maintained at a temperature in a range of about 250° C. to about 350° C. while forming the second TiN layer.

16. The method of claim 1, wherein the first TiN layer has a density in a range of about 3.5 $g/cm^3$ to about 3.8 $g/cm^3$ and wherein the TiN gapfill material has a density in a range of about 3.0 $g/cm^3$ to about 5.0 $g/cm^3$.

17. The method of claim 1, wherein the first TiN layer is amorphous when deposited.

18. The method of claim 1, wherein the TiN gapfill material is majority crystalline.

19. The method of claim 1, wherein the method completely fills the at least one feature without an etch process to remove material from the semiconductor substrate surface.

20. A method of depositing titanium nitride gapfill, the method comprising:

depositing a first TiN layer by a thermal decomposition process comprising exposing a semiconductor substrate surface to TDMAT, the semiconductor substrate surface comprising a plurality of stacked nanosheets and at least one feature between adjacent nanosheets, the first TiN layer forming around the plurality of nanosheets and the first TiN layer being amorphous; and exposing the first TiN layer to a plurality of cycles comprising a deposition phase and treatment phase, the deposition phase comprising TDMAT, the treatment phase comprising a nitrogen-containing plasma, to form a second TiN layer directly on the first TiN layer, wherein the first TiN layer and the second TiN layers combine to completely fill the at least one feature with a substantially crystalline TiN gapfill material which is substantially free of a seam.

* * * * *